United States Patent [19]

Liang et al.

[11] Patent Number: 4,888,390

[45] Date of Patent: Dec. 19, 1989

[54] RUBBERY COMPOUNDS AS MODIFIERS FOR POLY(ARYLENE SULFIDE)

[75] Inventors: Yeon F. Liang; William H. Beever, both of Bartlesville, Okla.

[73] Assignee: Phillips Petroleum Company, Bartlesville, Okla.

[21] Appl. No.: 802,282

[22] Filed: Nov. 27, 1985

Related U.S. Application Data

[62] Division of Ser. No. 552,884, Nov. 17, 1983, Pat. No. 4,581,411.

[51] Int. Cl.$^4$ .............................................. C08L 81/04
[52] U.S. Cl. .................................... 525/189; 525/150; 525/152; 525/537
[58] Field of Search ................ 525/189, 537, 150, 152

[56] References Cited

U.S. PATENT DOCUMENTS

| | | | |
|---|---|---|---|
| 3,641,207 | 2/1972 | Lauchlan | 525/150 |
| 3,920,770 | 11/1975 | Nakashio et al. | 525/152 |
| 4,021,596 | 5/1977 | Bailey | 428/375 |
| 4,134,874 | 1/1979 | Needham | 160/37 SB |
| 4,167,507 | 9/1979 | Haaf | 525/92 |
| 4,247,598 | 1/1981 | Blackwell | 428/419 |
| 4,476,284 | 10/1984 | Cleary | 525/189 |
| 4,493,917 | 1/1985 | Bailleux et al. | 525/189 |

*Primary Examiner*—Wilbert J. Briggs, Sr.
*Attorney, Agent, or Firm*—A. W. Umphlett

[57] ABSTRACT

A composition and method for forming the composition providing a molding composition of poly(arylene sulfide) and a crack resistance and/or an impact strength improving amount of a polymeric rubber chosen from among silicone rubber, ethylene-acrylic rubber, ethylene-propylene rubber, ethylene-propylene-diene rubber, and poly(butyl acrylate) rubber. In embodiments of the invention the improvement is enhanced by the addition of organosilane to the composition.

3 Claims, No Drawings

RUBBERY COMPOUNDS AS MODIFIERS FOR POLY(ARYLENE SULFIDE)

This application is a Division of application Ser. No. 552,884, now U.S. Pat. No. 4,581,411.

BACKGROUND OF THE INVENTION

This invention relates to compositions containing poly (arylene sulfide). In one of its aspects this invention relates to molding compositions containing poly(arylene sulfide). In another of its aspects this invention relates to a method for preparing compositions of poly(arylene sulfide) having improved impact strength and crack resistance.

Poly(arylene sulfide) is known to be useful as a molding composition. Among the characteristics of a molding composition that are important in determining the overall usefulness of the composition are the impact resistance or impact strength and the crack resistance. Molding compositions having good impact strength can be used in the molding of a great number of useful objects in which molding compositions that do not have good impact strength cannot be used because without good impact strength the molded objects tend to chip, crack or break when impacted with another object. Crack resistance is especially important in the molding of thick objects. It has now been found that the impact resistance and/or crack resistance of poly(arylene sulfide) can be improved by compounding with certain rubbery polymeric compounds. Using some of these rubbery compounds the impact strength can be further enhanced by the addition of cerain organic silanes.

It is therefore an object of this invention to provide a method for improving the impact strength and crack resistance of compositions containing poly(arylene sulfide), especially poly(phenylene sulfide). It is another object of this invention to provide compositions containing poly(arylene sulfide), especially poly(phenylene sulfide) which have improved impact strength and crack resistance. It is still another object of this invention to provide molded objects having improved impact strength and crack resistance.

Other aspects, objects and the various advantages of this invention will become apparent upon reading the specification and the appended claims.

STATEMENT OF THE INVENTION

According to this invention the impact strength and crack resistance of compositions containing poly(arylene sulfide) can be improved by the addition of an impact strength and crackc resistance improving amount of polymeric rubber chosen from among the group consisting of silicone rubber, ethylene-acrylic rubber, ethylene-propylene copolymer rubber, ethylene-propylene-diene terpolymer rubber, and poly(butyl acrylate) rubber.

In an embodiment of the invention a method is provided for improving the impact strength and crack resistance of a composition containing poly(phenylene sulfide) by admixing with a poly(phenylene sulfide) an impact strengh and crack resistance improving amount of a polymeric rubber chosen from among the group consisting essentially of silicone rubber, ethylene-acrylic rubber, ethylene-propylene copolymer rubber, ethylene-propylene-diene terpolymer rubber, and poly(butyl acrylate) rubber.

In embodiments of the invention the impact strength improvement is enhanced by the addition of an organosilane to the compositions containing poly(phenylene sulfide) and polymeric rubber.

The poly(phenylene sulfide) resins employed in the compositions are known polymers which have been set forth, for example, in U.S. Pat. No. 3,354,129 which issued November 21, 1967 to James T. Edmonds, Jr. and Harold Wayne Hill, Jr. The resins are normally solid materials which in an uncuredd or partially cured state can have melt flows in terms of g/10 minutes according to ASTM Method D-1238-70 (316° C. and 5 kg load) ranging from about 10 to about 10,000, more preferably from about 20 to about 3500. A presently preferred resin is poly(phenylene sulfide), abbreviated PPS.

The polymeric rubber used in the present invention is particularly effective for improving impact strength of poly(phenylene sulfide) when admixed therewith in amounts from about 0.1 to about 40 weight percent, preferably from about 0.5 to about 25 weight percent. The individual types of polymeric rubber can have a more preferred range of additive amount which will be discussed below.

The silicone rubber useful in the present invention can be described as a hydroxy-terminated diaryl silane/dialkyl silane copolymer. The silicone rubber additive is most preferably used in an amount of about 0.5 to about 10 weight percent in the composition.

The ethylene-acrylic rubber useful in the present invention can be described as a partially hydrolyzed ethylene-alkyl acrylate copolymer. The ethylene-acrylic rubber is most preferably used in an amount of about 0.5 to about 15 weight percent of the composition.

The ethylene-propylene rubber copolymer useful in this invention is most preferably used in an amount of about 0.5 to about 15 weight percent of the composition. Any rubbery ethylene-propylene copolymer is considered within the scope of this invention.

The ethylene-propylene-diene rubbery terpolymer is most preferably used in amount of about 0.5 to about 25 weight percent of the composition. Any ethylene-propylene-diene rubber terpolymer is considered within the scope of this invention.

The poly(butyl acrylate) rubber useful in the present invention can be describedd as a high molecular weight butyl acrylate-based rubber with hydroxy functionality. The poly(butyl acrylate) rubber is most preferably used in an amount of about 0.5 to about 25 weight percent of the composition.

When using either the silicone rubber or the poly(butyl acrylate) rubber it has been found that use of an organosilane in an amount of up to about 3 weight percent of the total composition, preferably about 0.1 to about 2 weight percent of the total composition, can further enhance the impact strength of the composition.

The organosilanes useful according to this invention can be described as alkyl or substituted alkyl trialkoxy silanes.

It is also within the scope of this invention that the compositions can contain other additives which can be chosen from reinforcing agents such as glass in the form of fibers or beads, fillers such as silica, clay, talc, calcium carbonate, and the like; processing aids such as lithium carbonate or oils or waxy compounds selected from among the N, N-alkylenebis (alkanamides), glyceride and phosphated glycerides of saturated fatty acids containing from 10 to 30 carbon atoms, mono- and dialkanolamides derived from saturated faty acids and esters derived from a saturated long chain fatty acid and long chain saturated aliphatic alcohol; and colorants including carbon black, titanium dioxide, cadmium sulfide, cadmium sulfoselenide, phthalocyanine blue, iron oxide, and the like.

In the preparation of the compositions of this invention the order of addition is not important and any known means of mixing the components can be used, preferably dry ingredients can be tumble mixed and subsequently extruded and ground to form a homogeneous powder. The powder can then be reheated for molding.

The following examples will be used to describe the invention and should be taken as illustrative and not restrictive.

EXAMPLE 1

This example demonstrates the effectiveness of a silicone rubber on the impact resistance of a poly(p-phenylene sulfide) referred to hereinafter as PPS. The example also describes the general procedure for preparing and evaluating test specimens which is as follows: 900 grams of PPS (MR03, Phillips Petroleum Co., melt flow 20-65 grams per 10 minutes measured in accordance with test method ASTM D1238 at 600° F.(316° C. using a 5 kilogram weight) and 100 grams of a silicone rubber (PSW 1049, Petrarch Systems, Inc.) preground in a Wiley mill were mixed in a tumble mixer for about 5 minutes at ambient room temperature. The mixture was extruded through a Davis Standard extruder at 600° F. (316° C.), ground into a granular or coarse powder, dried in a 350° F. (177° C.) oven for 3 hours and molded into test specimens, 5 inches×1 inch×0.125 inch using a New Britain molding machine (barrel 600° F., mold 275° F.). Izod impact properties were then determined according to test method ASTM D 256 on notched and unnotched specimens.

Generally 4 tests were made and the results averaged. The procedure was repeated at various concenrations of silicone rubber and with two different types of organosilanes. The procedure was also repeated with a control, that is, with only the PPS and no additives. These results are listed in Table I showing that the addition of between 5 and 10 weight percent of the silicone rubber greatly increases both notched and unnotched impact resistance (Runs 2 and 3). The data also indicate that adding organosilane sometimes increases impact and sometimes decreases impact but generally only slightly either way.

TABLE I

Effect of Silicone Rubber on the Impact Resistance of PPS

| | PPS Compositions Run | | | | | |
|---|---|---|---|---|---|---|
| | 1 | 2 | 3 | 4 | 5 | 6 |
| Components | | | | | | |
| PPS[a] | 1000 | 950 | 900 | 950 | 900 | 900 |
| Silicone Rubber[b] | — | 50 | 100 | 50 | 100 | 100 |
| Organosilane A[c] | — | — | — | 1 | 2 | — |
| Organosilane B[d] | — | — | — | — | — | 2 |
| Performance Property | | | | | | |
| Annealed[e] | | | | | | |
| Impact Strength, J/M | | | | | | |
| Notched | 49 | 66 | 72 | 67 | 80 | 77 |

TABLE I-continued

Effect of Silicone Rubber on the Impact Resistance of PPS

| | PPS Compositions Run | | | | | |
|---|---|---|---|---|---|---|
| | 1 | 2 | 3 | 4 | 5 | 6 |
| Unnotched | 344 | 584 | 436 | 435 | 414 | 542 |

Notes:
[a] MR03, Phillips Petroleum Co.
[b] PSW 1049, Petrarch Systems, Inc. Base polymer is a 15% diphenyl silane/85% dimethyl silane hydroxy-terminated copolymer, mol. wt. approx. 600,000. To this base polymer was compounded 35 parts of a 325 m$^2$/g surface area filler using 2 parts hexamethyldisilazane compounding aid. 1% Resin material (2 parts trimethylchlorosilane and 1 part ethylorthosilicate) was mixed into the rubber.
[c] A-189, 3- mercaptopropyltrimethoxysilane, Union Carbide
[d] A-1100, 3- aminopropyltriethoxysilane, Union Carbide
[e] Heated 185-195° C. for 2 to 4 hrs.

EXAMPLE II

This example demonstrates the effectiveness of any ethylene-acrylic rubber on the impact resistance of PPS. The proceddure described in Example I was repeated except the silicone elastomer was replaced with an ethylene-acrylic rubber, Vamac N-123. The results listed in Table II indicate the ethylene-acrylic rubber greatly increases impact resistance, particularly unannealed unnotched which was increased from 476 J/M to 1512 J/M.

TABLE II

Effect of Ethylene-Acrylic Rubber on the Impact Resistance of PPS

| | PPS Composition | |
|---|---|---|
| | Control | Invention |
| Components, grams | | |
| PPS[a] | 1000 | 900 |
| Ethylene-Acrylic rubber[b] | — | 100 |
| Performance Properties | | |
| Annealed[c] | | |
| Impact Strength, J/M | | |
| Notched | 49 | 71 |
| Unnotched | 344 | 614 |
| Unannealed | | |
| Impact Strength, J/M | | |
| Notched | 41 | 78 |
| Unnotched | 476 | 1512 |

[a] See footnote a, Table I
[b] Vamac N-123, 100 parts of an ethylene/acrylic elastomer plus 23 parts fumed silica. DuPont
[c] Heated 185-195° C. for 2 to 4 hrs.

EXAMPLE III

This example demonstrates the effectiveness of an ethylenepropylene rubbery copolymer (EPR) on impact resistance and crack resistance of PPS. In regards to impact resistance, the procedure described in Example I was again repeated except the silicone elastomer was replaced with an ethylene-propylene copolymer, EPsyn 7006. The results listed in Table III indicate the ethylene-propylene rubbery elastomer more than doubles and sometimes triples the impact resistance of PPS.

The effect of ethylene-propylene rubber on the crack resistance of a glass-filled PPS composition was determined by dry blending a composition comprised of 56.75 weight percent PPS (melt flow 173 from Phillips Petroleum Company), 40.00 weight percent fiberglass, 0.25 weight percent high density polyethylene (BX670 from Phillips Petroleum Company), 1.00 weight percent $Li_2CO_3$, 2.00 weight percent iron oxide pigment (Davis Brown 6623), and then adding variable amounts of the ethylene-propylene polymer to be tested. The composition was extruded as described in Example I into disks 2 inches in diameter X 0.5 inch thick. After cooling to ambient room temperature the disks were further processed in one of two methods. In one method the disks were cut circumferentially to a thickness of 0.25 inch, annealed for 2 hours at 400° F., stored at ambient room temperature for 24 to 48 hours and visually examined for cracks. Eight such disks were prepared and a value of the number of disks exhibiting any degree of cracking recorded. In an alternate method, the reverse was carried out, namely, the disks were annealed first then cut, stored and examined for cracks. The results are recorded in Table IV and indicate that various type ethylene-propylene rubbers ranging in degree of ethylene content, $M_n \times 10^3$, and Mooney value are satisfactory improving crack resistance of PPS compositions. The data also shows that the amount of rubber required for complete absence of cracking is about 2 weight percent but good cracking resistance is present even at 1 weight percent. PPS with varying melt flow as well as different composition ingredients and varying amounts will correspondingly alter the amount of ethylene-propylene rubber needed to provide satisfactory crack resistance.

TABLE III

| Effect of Ethylene-Propylene Rubber on the Impact Resistance of PPS | | |
|---|---|---|
| | PPS Composition | |
| | Control | Invention |
| Components, grams | | |
| PPS[a] | 1000 | 900 |
| Ethylene-Propylene copolymer[b] | — | 100 |
| Performance Properties | | |
| Annealed[c] | | |
| Impact Strength, J/M | | |
| Notched | 49 | 104 |
| Unnotched | 344 | 1160 |
| Unannealed | | |
| Impact strength, J/M | | |
| Notched | 41 | 114 |
| Unnotched | 476 | 1702 |

[a]See footnote a, Table I
[b]An ethylene-propylene copolymer, EPsyn 7006, 62–68 mole % ethylene, $M \times 10^3$ = 50–60, Mooney viscosity 70(ML-8 at 250F.), Copolymer Rubber and Chem. Corp.
[c]Heated 185–195° C. for 2 to 4 hrs.

TABLE IV

EFFECT OF ETHYLENE-PROPYLENE RUBBER ON THE CRACK RESISTANCE OF GLASS-FILLED PPS

Composition:  Wt. %
56.75 PPS[a]
40.00 Fiberglass
0.25 BX670 (High Density Polyethylene)
1.00 $Li_2CO_3$
2.00 Pigment
— Ethylene-Propylene Rubber

| Ethylene-Propylene Rubber | | | | Mooney | Cracks (No. of Disks Cracked Out of 8 Tested)[f] | |
|---|---|---|---|---|---|---|
| Trade Name | Wt. % | Mole % Ethylene | $M_n \times 10^3$ | ML-8 at 250° F. | Cut/—Annealed | Annealed/-Cut |
| 1. None (Control) | 0 | — | | — | 8 | 8 |
| 2. EPsyn 7006[b] | 1 | 62–68 | 50–60 | 70 | 2 | 3 |
| 3. EPsyn 7006[b] | 2 | 62–68 | 50–60 | 70 | 0 | 0 |
| 4. EPsyn 7006[b] | 3 | 62–68 | 50–60 | 70 | 0 | 0 |
| 5. EPsyn 4006[b] | 3 | >68 | 40–50 | 40 | 2 | 0 |
| 6. Vistalon 719[c] | 3 | 75 | — | 45–55[e] | 0 | 0 |
| 7. Epcar 807[d] | 3 | 70 ± 3 | 56 | 60 ± 6 | 0 | 0 |

[a]Melt Flow 173 available from Phillips Petroleum Company.
[b]Available from Copolymer Rubber and Chemical Corporation.
[c]Available from Exxon Chemicals Americas.
[d]Available from Polysar Incorp.
[e]ML-1 at 260° F.
[f]Sprue side of disks.

EXAMPLE IV

This example demonstrates the effectiveness of a poly(butyl acrylate) rubber with and without the optional use of an organosilane on the impact resistance of PPS. The procedure described in Example I was once again repeated except the silicone elastomer was replaced with a poly(butyl acrylate) rubber, HYCAR 4004. The results listed in Table V show significant improvements in impact resistance of PPS particularly as the amount of poly(butyl acrylate) rubber is increased from 5% (Run 2) to 25% (Run 4). The data also indicates that organosilanes (1 weight %) enhance the butyl acrylate performance. It appears that when only a small amount of butyl acrylate rubber (5%) is added to the PPS other properties such as tensilel strength, flexural modulus and flexural strength are improved particularly when an organosilane is present (Compare Run 3 with 2 and 1). As the amount of butyl acrylate is increased to 25% these strength properties are decreased (Compare Run 3 with Runs 4, 5).

TABLE V

Effect of Poly(Butyl Acrylate) Rubber on the Impact Resistance of PPS

|  | Run 1 | 2 | 3 | 4 | 5 |
|---|---|---|---|---|---|
| Components, grams |  |  |  |  |  |
| PPS[a] | 1000 | 950 | 950 | 750 | 750 |
| Rubber[b] | — | 50 | 50 | 250 | 250 |
| Organosilane[c] | — | — | 10 | — | 10 |
| Performance Properties[d] |  |  |  |  |  |
| Annealed[e] |  |  |  |  |  |
| Flex. Modulus, MPa | 3282 | 3146 | 3620 | 1864 | 1842 |
| Flex. Strength, MPa | 120 | 109 | 127 | 67 | 68 |
| Ten. Strength, MPa | 82 | 71 | 83 | 59 | 57 |
| Impact Strength, J/M |  |  |  |  |  |
| Notched | 49 | 53 | 50 | 64 | 88 |
| Unnotched | 344 | 304 | 411 | 798 | 1097 |
| Heat Distortion, °C. | 110 | 108 | 108 | 102 | 102 |
| Unannealed |  |  |  |  |  |
| Flex. Modulus, MPa | 2814 | 2681 | 3094 | 1732 | 1663 |
| Flex. Strength, MPa | 105 | 91 | 105 | 47 | 51 |
| Ten. Strength, MPa | 60 | 52 | 72 | 47 | 49 |
| Impact Strength, J/M |  |  |  |  |  |
| Notched | 41 | 51 | 44 | 74 | 111 |
| Unnotched | 476 | 351 | 427 | 824 | 1005 |
| Heat Distortion, °C. | 79 | 76 | 78 | 74 | 75 |

[a]See footnote a, Table I
[b]HYCAR 4004, high molecular weight polymer based on butyl acrylate with hydroxy functionality from B. F. Goodrich
[c]A1100, 3-aminopropyltriethoxysilane, Union Carbide
[d]Run in accordance with test methods
Flex. Mod., Flex. St. ASTM D790
Ten. St. ASTM D636
Izod Impact ASTM D256
Heat Distortion, °C. ASTM D648
[e]Heated 185-195° C. for 2 to 4 hrs.

EXAMPLE V

This example demonstrates the effectiveness of an ethylene-propylene-diene rubber (EPDM) on impact resistance and crack resistance of PPS. Both the impact resistance and crack resistance sample preparation and evaluations were carried out in the same manner as previously described. The results listed in table VI indicate the ethylene-propylene-diene rubbery elastomer significantly improves the impact resistance of PPS. Similarly the results listed in Table VII indicate the ethylene-propylene-diene rubbery elastomer generally eliminates all cracks in molded PPS compositions.

TABLE VI

EFFECT OF ETHYLENE-PROPYLENE-DIENE RUBBER ON THE IMPACT RESISTANCE OF PPS

|  | PPS Composition 1 | 2 |
|---|---|---|
| Composition: grams |  |  |
| PPS[a] | 1000 | 900 |
| Ethylene-Propylene-Diene Rubber A[b] | — | 100 |
| Performance Property: |  |  |
| Annealed[d] |  |  |
| Impact Strength |  |  |
| Notched | 35 | 60 |
| Unnotched | 294 | 352 |

[a]See footnote Table I.
[b]Ethylene-propylene-hexadiene rubbery polymer, Nordel 2722 available from DuPont.

Table VII

EFFECT OF ETHYLENE-PROPYLENE-DIENE RUBBER ON THE CRACK RESISTANCE OF PPS

| Composition: | wt. % |
|---|---|
|  | 55.10 PPS[a] |
|  | 38.84 Fiberglass |
|  | 0.24 BX670 (High Density Polyethylene) |
|  | 0.97 Li$_2$SO$_3$ |
|  | 1.94 Pigment |
|  | 2.91 Ethylene-Propylene-Diene Rubber |

|  | Cracks (No. of Disks Cracked Out of 8 Tested)[d] | |
|---|---|---|
|  | Cut/ Annealed | Annealed/ Cut |
| 1. None (Control) | 8 | 8 |
| 2. Ethylene-Propylene-Diene Rubber A[b] | 0 | 0 |
| 3. Ethylene-Propylene-Diene Rubber B[c] | 1 | 0 |

[a]PPS melt flow 173 from Phillips Petroleum Company.
[b]Diene portion is ethylidene-norbornene with 5 double bonds per molecule, Available from Copolymer Rubber and Chemical Corporation under the tradename EPsyn 2506.
[c]Diene portion is hexadiene, available from DuPont under the tradename Nordel 2722.
[d]Sprue side of disks.

We claim:
1. A molding composition comprising poly(arylene sulfide) and an impact strength and/or crack resistance improving amount of ethylene-propylene-diene rubber.
2. A composition of claim 1 wherein the amount of ethylene-propylene-diene rubber is in a range of about 0.1 o about 40 weight percent of the composition.
3. A composition of claim 2 wherein the amount of ethylene-propylene-diene rubber is in a range of about 0.5 to about 25 weight percent of the total composition.

* * * * *

UNITED STATES PATENT AND TRADEMARK OFFICE
CERTIFICATE OF CORRECTION

PATENT NO. : 4,888,390

DATED : December 19, 1989

INVENTOR(S) : YEON F. LIANG and WILLIAM H. BEEVER

It is certified that error appears in the above-identified patent and that said Letters Patent is hereby corrected as shown below:

Claim 2, column 8, line 46, after "about 0.1" the "o" should be removed and "to" should be inserted.

Signed and Sealed this

Twentieth Day of August, 1991

Attest:

HARRY F. MANBECK, JR.

Attesting Officer

Commissioner of Patents and Trademarks